(12) United States Patent
Zhou

(10) Patent No.: US 11,063,246 B2
(45) Date of Patent: Jul. 13, 2021

(54) MANUFACTURING METHOD OF ORGANIC LIGHT EMITTING DIODE BACK PLATE AND THE ORGANIC LIGHT EMITTING DIODE BACK PLATE

(71) Applicant: Shenzhen China Star Optoelectronics Technology Co., Ltd., Shenzhen (CN)

(72) Inventor: Xingyu Zhou, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 393 days.

(21) Appl. No.: 16/099,183

(22) PCT Filed: Sep. 19, 2018

(86) PCT No.: PCT/CN2018/106580
§ 371 (c)(1),
(2) Date: Nov. 5, 2018

(87) PCT Pub. No.: WO2019/223198
PCT Pub. Date: Nov. 28, 2019

(65) Prior Publication Data
US 2021/0119185 A1    Apr. 22, 2021

(30) Foreign Application Priority Data
May 21, 2018   (CN) .......................... 201810488940.8

(51) Int. Cl.
*H01L 51/56* (2006.01)
*H01L 27/32* (2006.01)

(52) U.S. Cl.
CPC .......... *H01L 51/56* (2013.01); *H01L 27/3246* (2013.01); *H01L 2227/323* (2013.01); *H01L 2251/306* (2013.01); *H01L 2251/308* (2013.01)

(58) Field of Classification Search
None
See application file for complete search history.

(56) References Cited

U.S. PATENT DOCUMENTS 9,786,721 B1 * 10/2017 Tang .................... H01L 27/3246
2004/0263065 A1 * 12/2004 Yeh ...................... H01L 27/3244
                                                                      313/504

(Continued)

FOREIGN PATENT DOCUMENTS

CN          104297980 A     1/2015
CN          104576957 A     4/2015
(Continued)

*Primary Examiner* — Michelle Mandala
(74) *Attorney, Agent, or Firm* — Leong C. Lei

(57) ABSTRACT

Provided are a manufacturing method of an organic light emitting diode back plate and the organic light emitting diode back plate. In the manufacturing method of an OLED back plate, pixel openings and light blocking grooves correspondingly above active layers are formed in a pixel definition layer. Then, OLED light-emitting functional layers are formed in the pixel openings and the black light shielding blocks completely covering the active layers are formed in the light shielding grooves by ink jet printing, thereby effectively preventing the TFT elements from being affected by the illumination and ensuring the characteristics of the TFT elements. The structure is simple and the production cost is low.

8 Claims, 3 Drawing Sheets

(56) References Cited

U.S. PATENT DOCUMENTS

| | | | | |
|---|---|---|---|---|
| 2015/0249120 A1* | 9/2015 | Cheng | ................ | H01L 27/3272 257/40 |
| 2019/0067398 A1* | 2/2019 | Liu | .................... | H01L 27/3262 |
| 2019/0094636 A1* | 3/2019 | Kang | ................ | G02F 1/13439 |

FOREIGN PATENT DOCUMENTS

| | | | |
|---|---|---|---|
| CN | 106129104 A | 11/2016 | |
| CN | 106601754 A | 4/2017 | |
| CN | 107644951 A | 1/2018 | |
| CN | 108538902 A | 9/2018 | |

* cited by examiner

MANUFACTURING METHOD OF ORGANIC LIGHT EMITTING DIODE BACK PLATE AND THE ORGANIC LIGHT EMITTING DIODE BACK PLATE

FIELD OF THE INVENTION

The present invention relates to a display field, and more particularly to a manufacturing method of an organic light emitting diode back plate and the organic light emitting diode back plate.

BACKGROUND OF THE INVENTION

A flat panel display possesses advantages of being ultra thin, power saved and radiation free and has been widely utilized. Present flat panel displays mainly comprise a LCD (Liquid Crystal Display) or an OLED (Organic Light Emitting Display).

The LCD display device possesses advantages of high image quality, power saving, thin body and wide application scope. Thus, it has been widely applied in various consumer electrical products, such as mobile phone, television, personal digital assistant, digital camera, notebook, laptop, and becomes the major display device. An OLED display is an active light emitting display, which possesses outstanding properties of self-illumination, high contrast, wide view angle, fast response, high luminous efficiency, low operation voltage, ultra-thin and etc. The display devices utilizing OLED technology has possibility to have a lighter, thinner, charming appearance, more excellent color display quality, wider view range and greater design flexibility.

Thin Film transistors (TFT) are important components of a flat panel display which can be formed on a glass substrate or a plastic substrate. Generally, the thin film transistors are employed as switching elements and driving elements utilized such as LCD display devices and OLED display devices.

The metal oxide semiconductor TFT technology is the most popular skill at present. The metal oxide semiconductors have higher electron mobility, and compared with the low temperature polysilicon (LTPS), the metal oxide semiconductor TFTs have a simple process and are more compatible than amorphous silicon (a-Si) TFT processes, and can be applied to LCD display devices and OLED display devices. The metal oxide semiconductor TFTs are suitable for various sizes display, and possess good application development prospects, and are popular in the current industry research.

Since the metal oxide semiconductor is relatively sensitive to light, the threshold voltage of the metal oxide semiconductor TFT is significantly negatively shifted after the metal oxide semiconductor is irradiated with light. An improved method is to provide a metal light shielding layer under the active layer of the metal oxide semiconductor material to eliminate the threshold drift of the TFT caused by illumination. Although the metal light shielding layer is not connected to other charged structure layers in the TFT structure, it is easily affected by voltages on other charged structure layers, thereby carrying various voltages. Since the metal light shielding layer has a variable voltage, thus the threshold voltage as the TFT works will constantly change, resulting in unstable TFT operation.

The OLED includes an anode, an organic functional layer and a cathode which are sequentially formed on a substrate. At present, the respective function material layers and the cathode metal layer are manufactured by vacuum thermal evaporating. In the vacuum chamber, the organic small molecule material is heated to be sublimated or gasified to be material vapor. Then, it deposed on the glass substrate with the opens of the metal mask (Mask). However, due to the high cost of vacuum thermal evaporation, the commercialization of OLED displays is limited.

The Ink-jet Print (IJP) has advantages of high material utilization, which is the key of solving the cost issue of the large scale OLED display. In comparison with the traditional vacuum evaporation of prior art, the IJP skill possesses many advantages of material saving, gentle process condition and more uniform film formation and thus has more potential applications. The method is to drop the function material ink into the predetermined pixel areas with a plurality of nozzles. Then, the required pattern is formed after the solvent is evaporated.

SUMMARY OF THE INVENTION

An objective of the present invention is to provide a manufacturing method of an OLED back plate, in which the pixel definition layer is provided with a light shielding groove correspondingly above the active layer, and the black light shielding block completely covering the active layer is formed in the light shielding groove, thereby effectively preventing the TFT element from being affected by the illumination and ensuring the characteristics of the TFT element. The process is simple and the production cost is low.

An objective of the present invention is to provide an OLED back plate, of which the pixel definition layer is provided with a light shielding groove correspondingly above the active layer, and the black light shielding block completely covering the active layer is disposed in the light shielding groove, thereby effectively preventing the TFT element from being affected by the illumination and ensuring the characteristics of the TFT element. The structure is simple and the production cost is low.

For realizing the aforesaid objectives, the present invention provides a manufacture method of an OLED back plate, comprising steps of:

Step S1, providing a base substrate, and forming a thin film transistor (TFT) layer on the base substrate, and forming a planarization layer on the TFT layer, and forming a plurality of pixel electrodes on the planarization layer;

wherein the TFT layer comprises a plurality of TFT elements, and the TFT element comprises an active layer, and a material of the active layer is a metal oxide semiconductor material;

Step S2, forming a pixel definition layer on the planarization layer and the plurality of pixel electrodes, and forming a plurality of pixel openings in the pixel definition layer correspondingly on the plurality of pixel electrodes, and forming a plurality of light shielding grooves in the pixel definition layer correspondingly above the active layers of the plurality of TFT elements;

Step S3, correspondingly forming a plurality of OLED light-emitting functional layers in the plurality of pixel openings by ink jet printing, and meanwhile, correspondingly forming a plurality of black light-shielding blocks in the plurality of light-shielding grooves by ink jet printing, wherein the black light-shielding block completely covers the active layer below the black light-shielding block to shield the active layer from light.

In Step S1, a material of the active layer is indium gallium zinc oxide, indium zinc tin oxide or indium gallium zinc tin oxide.

In Step S1, the TFT element is an etch stop layer TFT element, a back channel etch TFT element or a top gate TFT element.

In Step S3, a material of forming the black light-shielding blocks is a black photoresist material.

In Step S3, the formed plurality of OLED light-emitting functional layers comprises red OLED light emitting function layers, green OLED light emitting function layers and blue OLED light emitting function layers which are spaced apart; the red OLED light emitting function layers, the green OLED light emitting function layers and the blue OLED light emitting function layers are arranged in an order or in an array.

The present invention further provides an organic light emitting diode (OLED) back plate, comprising a base substrate, a thin film transistor (TFT) layer disposed on the base substrate, a planarization layer disposed on the TFT layer, a plurality of pixel electrodes disposed on the planarization layer, a pixel definition layer disposed on the planarization layer and the plurality of pixel electrodes, a plurality of pixel openings and a plurality of light shielding grooves disposed in the pixel definition layer, a plurality of OLED light-emitting functional layers respectively disposed in the plurality of pixel openings and a plurality of black light-shielding blocks respectively disposed in the plurality of light shielding grooves;

wherein the TFT layer comprises a plurality of TFT elements, and the TFT element comprises an active layer, and a material of the active layer is a metal oxide semiconductor material;

the plurality of pixel openings are respectively disposed on the plurality of pixel electrodes;

the plurality of light shielding grooves are respectively disposed above the active layers of the plurality of TFT elements, and the black light-shielding block completely cover the active layer to shield the active layer from light.

A material of the active layer is indium gallium zinc oxide, indium zinc tin oxide or indium gallium zinc tin oxide.

The TFT element is an etch stop layer TFT element, a back channel etch TFT element or a top gate TFT element.

A material of forming the black light-shielding blocks is a black photoresist material.

The formed plurality of OLED light-emitting functional layers comprises red OLED light emitting function layers, green OLED light emitting function layers and blue OLED light emitting function layers which are spaced apart; the red OLED light emitting function layers, the green OLED light emitting function layers and the blue OLED light emitting function layers are arranged in an order or in an array.

The benefits of the present invention are: in the manufacturing method of an OLED back plate, pixel openings and light blocking grooves correspondingly above active layers are formed in a pixel definition layer. Then, OLED light-emitting functional layers are formed in the pixel openings and the black light shielding blocks completely covering the active layers are formed in the light shielding grooves by ink jet printing, thereby effectively preventing the TFT elements from being affected by the illumination and ensuring the characteristics of the TFT elements. The structure is simple and the production cost is low. The pixel definition layer of the OLED back plate of the present invention is provided with a light shielding groove correspondingly above the active layer, and the black light shielding block completely covering the active layer is disposed in the light shielding groove, thereby effectively preventing the TFT element from being affected by the illumination and ensuring the characteristics of the TFT element. The structure is simple and the production cost is low.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
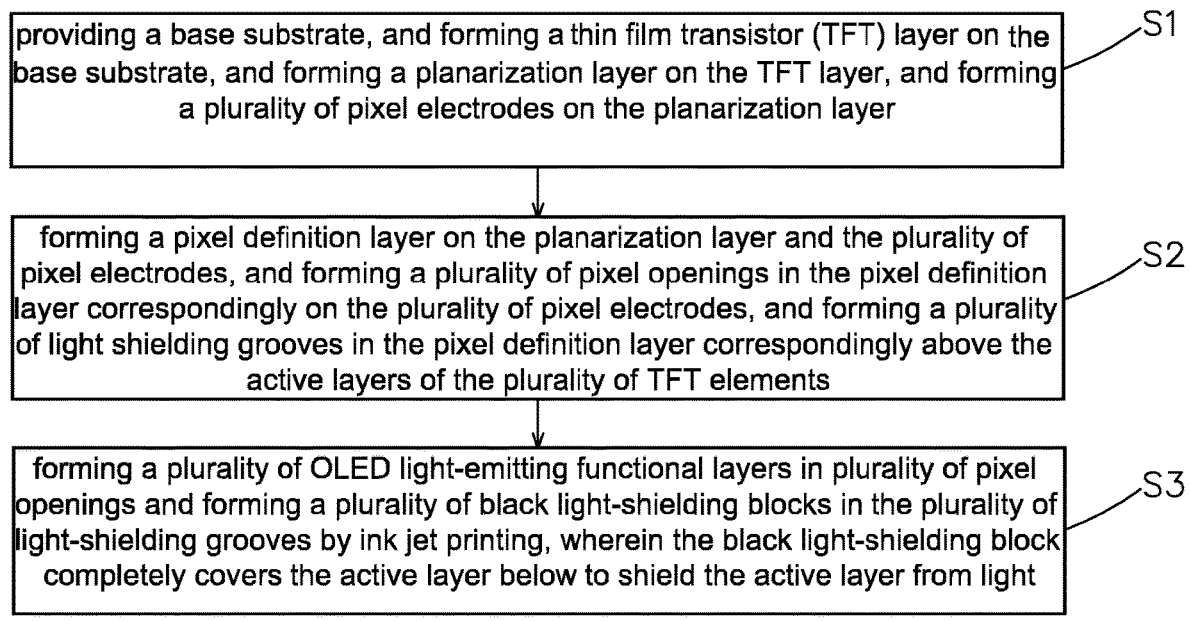
FIG. 1 is a flowchart of a manufacturing method of an OLED back plate according to the present invention.
Figure 2:
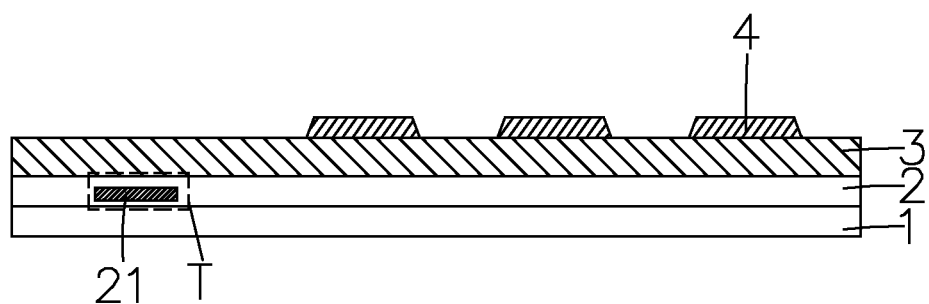
FIG. 2 is a diagram of Step S1 of a manufacturing method of an OLED back plate according to the present invention.

Please refer to FIG. 1. The present invention first provides a manufacturing method of a manufacturing method of an organic light emitting diode (OLED) black plate, comprising:

Step S1, as shown in FIG. 2, providing a base substrate 1, and forming a thin film transistor (TFT) layer 2 on the base substrate 1, and forming a planarization layer 3 on the TFT layer 2, and forming a plurality of pixel electrodes 4 on the planarization layer 3; wherein the TFT layer 2 comprises a plurality of TFT elements T, and the TFT element T comprises an active layer 21, and a material of the active layer 21 is a metal oxide semiconductor material.

Specifically, in Step S1, a material of the active layer 21 is indium gallium zinc oxide (IGZO), indium zinc tin oxide (IZTO), indium gallium zinc tin oxide (IGZTO) or other metal oxide semiconductor materials.

Specifically, in Step S1, the TFT element can be an etch stop layer TFT element, a back channel etch TFT element, a top gate TFT element or TFT elements of other structures.

Figure 3:
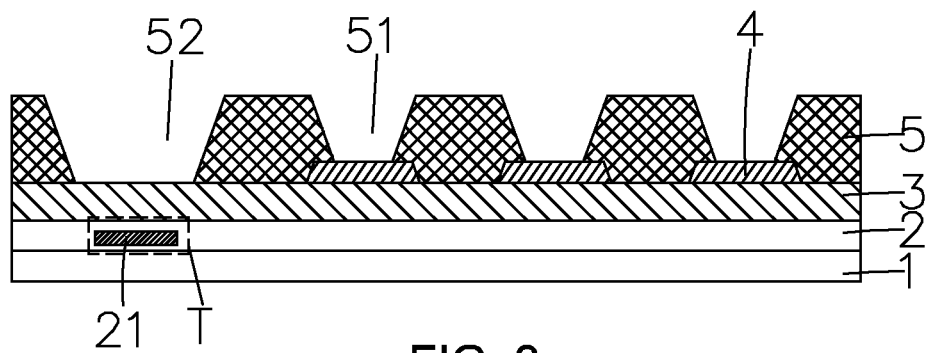
FIG. 3 is a diagram of Step S2 of a manufacturing method of an OLED back plate according to the present invention.

Step S2, as shown in FIG. 3, forming a pixel definition layer 5 on the planarization layer 3 and the plurality of pixel electrodes 4, and forming a plurality of pixel openings 51 in the pixel definition layer 5 correspondingly on the plurality of pixel electrodes 4, and forming a plurality of light shielding grooves 52 in the pixel definition layer 5 correspondingly above the active layers 21 of the plurality of TFT elements T.

Figure 4:
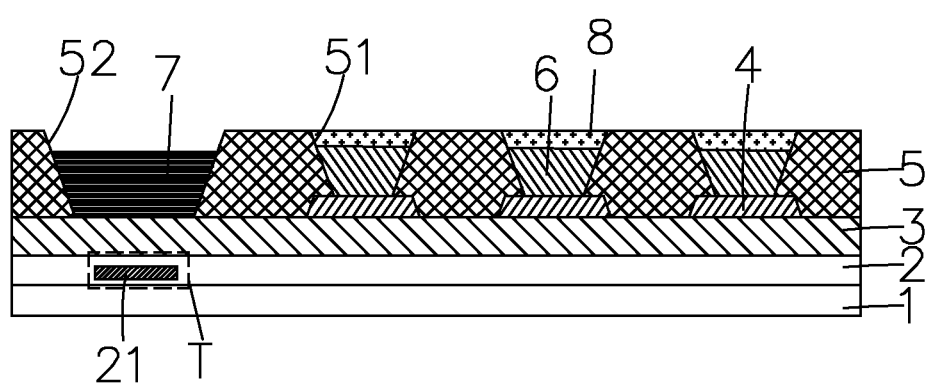
FIG. 4 is a diagram of Step 3 of a manufacturing method of an OLED back plate according to the present invention and is also a structure diagram of the OLED back plate according to the present invention.

Step S3, as shown in FIG. 4, correspondingly forming a plurality of OLED light-emitting functional layers 6 in the plurality of pixel openings 51 by ink jet printing, and meanwhile, ink jet printing black ink in the plurality of light-shielding grooves 52 by ink jet printing to respectively form a plurality of black light-shielding blocks 7, wherein the black light-shielding block 7 completely covers the active layer 21 below the black light-shielding block to shield the active layer 21 from light.

Specifically, a material of the black light shielding blocks 7 formed in Step S3 is a black photoresist material, such as a material for forming a black matrix (BM) in the liquid crystal panel technology of the prior art.

Specifically, the plurality of OLED light-emitting functional layers 6 formed in Step S3, comprises red (R) OLED light emitting function layers, green (G) OLED light emitting function layers and blue (B) OLED light emitting function layers which are spaced apart; the red OLED light emitting function layers, the green OLED light emitting function layers and the blue OLED light emitting function layers are arranged in an order or in an array.

Specifically, Step S3 further includes forming an upper electrode layer 8 on the plurality of OLED light-emitting function layers 6, and each of the pixel electrodes 4, the corresponding OLED light emitting function layer 6 and the corresponding upper electrode layer 8 together form an OLED element.

In the manufacturing method of OLED back plate according to the present invention, the pixel openings 51 and light blocking grooves 52 correspondingly above the active layers 21 are formed in a pixel definition layer 5. Then, the OLED light-emitting functional layers 6 are formed in the pixel openings 51 and the black light shielding blocks 7 completely covering the active layers 21 are formed in the light shielding grooves 52 by ink jet printing, thereby effectively preventing the TFT elements T from being affected by the illumination and ensuring the characteristics of the TFT elements T. The structure is simple and the production cost is low.

Based on the aforesaid manufacturing method of the OLED back plate, as shown in FIG. 4, the present invention further provides an OLED back plate, comprising a base substrate 1, a thin film transistor (TFT) layer 2 disposed on the base substrate 1, a planarization layer 3 disposed on the TFT layer 2, a plurality of pixel electrodes 4 disposed on the planarization layer 3, a pixel definition layer 5 disposed on the planarization layer 3 and the plurality of pixel electrodes 4, a plurality of pixel openings 51 and a plurality of light shielding grooves 52 disposed in the pixel definition layer 5, a plurality of OLED light-emitting functional layers 6 respectively disposed in the plurality of pixel openings 51, a plurality of black light-shielding blocks 7 respectively disposed in the plurality of light shielding grooves 52 and an upper electrode layer 8 disposed on the plurality of OLED light-emitting functional layers 6;

wherein the TFT layer 2 comprises a plurality of TFT elements T, and the TFT element T comprises an active layer 21, and a material of the active layer 21 is a metal oxide semiconductor material;

the plurality of pixel openings 51 are respectively disposed on the plurality of pixel electrodes 4;

the plurality of light shielding grooves 52 are respectively disposed above the active layers 21 of the plurality of TFT elements T, and the black light-shielding block 7 completely cover the active layer 21 to shield the active layer 21 from light.

Specifically, each of the pixel electrodes 4, the corresponding OLED light emitting function layer 6 and the corresponding upper electrode layer 8 together form an OLED element.

Specifically, a material of the active layer 21 is indium gallium zinc oxide, indium zinc tin oxide, indium gallium zinc tin oxide or other metal oxide semiconductor materials.

Specifically, the TFT element T can be an etch stop layer TFT element, a back channel etch TFT element, a top gate TFT element or TFT elements of other structures.

Specifically, a material of forming the black light-shielding blocks 7 is a black photoresist material.

Specifically, the plurality of OLED light-emitting functional layers 6 comprises red OLED light emitting function layers, green OLED light emitting function layers and blue OLED light emitting function layers which are spaced apart; the red OLED light emitting function layers, the green OLED light emitting function layers and the blue OLED light emitting function layers are arranged in an order or in an array.

The pixel definition layer 5 of the OLED back plate of the present invention is provided with a light shielding groove 52 correspondingly above the active layer 21, and the black light shielding block 7 completely covering the active layer 21 is disposed in the light shielding groove 52, thereby effectively preventing the TFT element T from being affected by the illumination and ensuring the characteristics of the TFT element T. The structure is simple and the production cost is low.

In conclusion, in the manufacturing method of an OLED back plate, pixel openings and light blocking grooves correspondingly above active layers are formed in a pixel definition layer. Then, OLED light-emitting functional layers are formed in the pixel openings and the black light shielding blocks completely covering the active layers are formed in the light shielding grooves by ink jet printing, thereby effectively preventing the TFT elements from being affected by the illumination and ensuring the characteristics of the TFT elements. The structure is simple and the production cost is low. The pixel definition layer of the OLED back plate of the present invention is provided with a light shielding groove correspondingly above the active layer, and the black light shielding block completely covering the active layer is disposed in the light shielding groove, thereby effectively preventing the TFT element from being affected by the illumination and ensuring the characteristics of the TFT element. The structure is simple and the production cost is low.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an organic light emitting diode (OLED) back plate, comprising steps of:
    Step S1, providing a base substrate, and forming a thin film transistor (TFT) layer on the base substrate, and forming a planarization layer directly on the TFT layer, and forming a plurality of pixel electrodes on the planarization layer;
    wherein the TFT layer comprises a plurality of TFT elements, and the TFT element comprises an active layer, and a material of the active layer is a metal oxide semiconductor material;
    Step S2, forming a pixel definition layer on the planarization layer and the plurality of pixel electrodes, and forming a plurality of pixel openings in the pixel definition layer correspondingly on the plurality of pixel electrodes, and forming a plurality of light shielding grooves in the pixel definition layer correspondingly above the active layers of the plurality of TFT elements;
    Step S3, correspondingly forming a plurality of OLED light-emitting functional layers in the plurality of pixel openings by ink jet printing, and meanwhile, correspondingly forming a plurality of black light-shielding blocks made of a black photoresist material in the plurality of light-shielding grooves by ink jet printing in Step S3, wherein the black light-shielding block completely covers the active layer below the black light-shielding block to shield the active layer from light.

2. The manufacture method of an OLED back plate according to claim 1, wherein in Step S1, a material of the active layer is indium gallium zinc oxide, indium zinc tin oxide or indium gallium zinc tin oxide.

3. The manufacture method of an OLED back plate according to claim 1, wherein in Step S1, the TFT element is an etch stop layer TFT element, a back channel etch TFT element or a top gate TFT element.

4. The manufacture method of an OLED back plate according to claim 1, wherein in Step S3, the formed plurality of OLED light-emitting functional layers comprises red OLED light emitting function layers, green OLED light emitting function layers and blue OLED light emitting function layers which are spaced apart; the red OLED light emitting function layers, the green OLED light emitting function layers and the blue OLED light emitting function layers are arranged in an order or in an array.

5. An organic light emitting diode (OLED) back plate, comprising a base substrate, a thin film transistor (TFT) layer disposed on the base substrate, a planarization layer directly disposed on the TFT layer, a plurality of pixel electrodes disposed on the planarization layer, a pixel definition layer disposed on the planarization layer and the plurality of pixel electrodes, a plurality of pixel openings and a plurality of light shielding grooves disposed in the pixel definition layer, a plurality of OLED light-emitting functional layers respectively disposed in the plurality of pixel openings and a plurality of black light-shielding blocks, made of a black photoresist material, respectively disposed in the plurality of light shielding grooves;

wherein the TFT layer comprises a plurality of TFT elements, and the TFT element comprises an active layer, and a material of the active layer is a metal oxide semiconductor material;

the plurality of pixel openings are respectively disposed on the plurality of pixel electrodes;

the plurality of light shielding grooves are respectively disposed above the active layers of the plurality of TFT elements, and the black light-shielding block completely cover the active layer to shield the active layer from light.

6. The OLED back plate according to claim 5, wherein a material of the active layer is indium gallium zinc oxide, indium zinc tin oxide or indium gallium zinc tin oxide.

7. The OLED back plate according to claim 5, wherein the TFT element is an etch stop layer TFT element, a back channel etch TFT element or a top gate TFT element.

8. The OLED back plate according to claim 5, wherein the formed plurality of OLED light-emitting functional layers comprises red OLED light emitting function layers, green OLED light emitting function layers and blue OLED light emitting function layers which are spaced apart; the red OLED light emitting function layers, the green OLED light emitting function layers and the blue OLED light emitting function layers are arranged in an order or in an array.

* * * * *